United States Patent
Wu et al.

(10) Patent No.: US 9,341,660 B2
(45) Date of Patent: May 17, 2016

(54) LOAD IMPEDANCE ESTIMATION AND REPETITIVE CONTROL METHOD CAPABLE OF ALLOWING INDUCTANCE VARIATION FOR INVERTER

(71) Applicant: National Tsing Hua University, Hsinchu (TW)

(72) Inventors: Tsai-Fu Wu, Hsinchu (TW); Li-Chiun Lin, Hsinchu (TW); Chih-Hao Chang, Hsinchu (TW); Po-Hung Li, Hsinchu (TW)

(73) Assignee: National Tsing Hua University (TW)

( * ) Notice: Subject to any disclaimer, the term of this patent is extended or adjusted under 35 U.S.C. 154(b) by 157 days.

(21) Appl. No.: 14/324,103

(22) Filed: Jul. 4, 2014

(65) Prior Publication Data

US 2015/0311818 A1    Oct. 29, 2015

(30) Foreign Application Priority Data

Apr. 23, 2014  (TW) .............................. 103114735 A

(51) Int. Cl.
*H02M 7/537* (2006.01)
*G01R 27/02* (2006.01)
*H02M 7/5387* (2007.01)

(52) U.S. Cl.
CPC ........... *G01R 27/02* (2013.01); *H02M 7/53873* (2013.01)

(58) Field of Classification Search
CPC ..... H02M 7/003; H02M 7/537; H02M 7/538; H02M 7/5387; H02M 3/335; H02M 3/33592; Y02B 70/1441; Y02B 70/1475
USPC .......................................... 363/127, 131, 132
See application file for complete search history.

(56) References Cited

U.S. PATENT DOCUMENTS

| | | | |
|---|---|---|---|
| 6,404,655 B1 * | 6/2002 | Welches | H02M 7/53875 363/17 |
| 2005/0063202 A1 * | 3/2005 | Stancu | H02M 1/12 363/40 |
| 2005/0117375 A1 * | 6/2005 | Xu | H02J 3/18 363/95 |
| 2010/0172166 A1 * | 7/2010 | Singh | H02M 1/42 363/131 |
| 2014/0160818 A1 * | 6/2014 | Garces | H02M 7/5395 363/97 |
| 2015/0311818 A1 * | 10/2015 | Wu | H02M 7/53873 363/131 |

* cited by examiner

*Primary Examiner* — Yemane Mehari

(57) ABSTRACT

The present invention provides a load impedance estimation and repetitive control method capable of allowing inductance variation for an inverter, wherein the method is applied for predicting corresponding next-period switching duty cycles for four switching member sets of the inverter by way of sampling three phase voltages and calculating next-period voltage compensations based on the previous line-period voltage compensations. Moreover, during the calculation and prediction, the method also involves the inductance variations of the output inductors of the inverter into the load impedance estimation matrix equation. Therefore, the three phases four wires inverter with the presented load impedance estimation and repetitive control method can provide a steady output voltage to the loads even if the originally-connected loads are replaced with other different loads. Thus, this load impedance estimation and repetitive control method can indeed improve the drawbacks of the inverter controller based on conventional DQ transformation method.

8 Claims, 16 Drawing Sheets

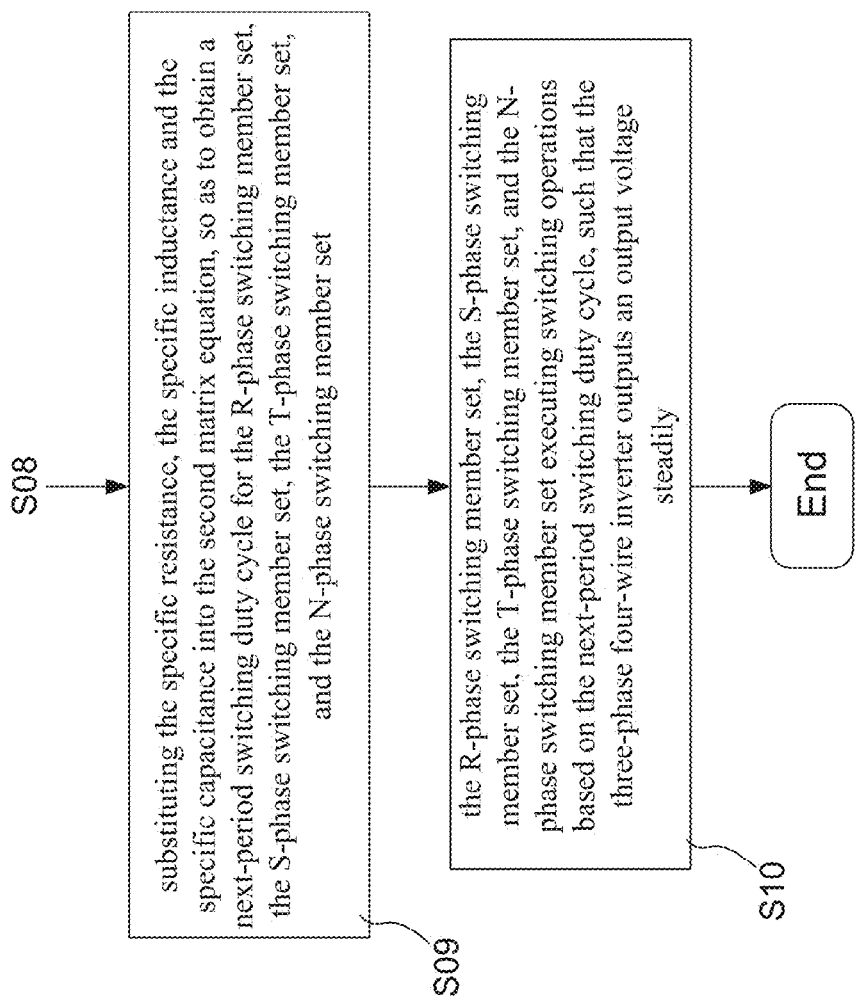

LOAD IMPEDANCE ESTIMATION AND REPETITIVE CONTROL METHOD CAPABLE OF ALLOWING INDUCTANCE VARIATION FOR INVERTER

BACKGROUND OF THE INVENTION

1. Field of the Invention

The present invention relates to the technology field of inverter controlling methods, and more particularly to a load impedance estimation and repetitive control method capable of allowing inductance variation for inverter.

2. Description of the Prior Art

With high developments of sciences and technologies, the requirements on electric power and power quality made by high-tech equipment grow with passing days. In order to avoid the execution of normal works from influence, it is extremely important to ensure the continuity and stability of the electric power supplied to the semiconductor manufacture processing equipment or the network server computers. For this reason, an uninterruptible power system (UPS) is provided for supplying back-up electricity to the electrical equipment when the electric grid is at an abnormal situation.

For enhancing the efficiency of the UPS, researchers propose a variety of control method for the controller of the UPS, such as dead-beat control, sliding mode control, pole-placement algorithm, and repetitive control. In above-mentioned methods, although the dead-beat control is able to increase the response speed of the inverter, the dead-beat control cannot effectively eliminate the harmonic distortion from the output current of the inverter when a non-linear load is connected to the inverter. Besides, in spite of the sliding mode control can enhance the dynamic response of the inverter by way of feed-forward compensation, it is difficult to determine a suitable sliding surface for the sliding mode control. Moreover, both the pole-placement algorithm and the repetitive control have the same shortcoming of complex mathematical derivation.

In 2002, Fred C. Lee proposed a 3D SVPWM (Three Dimensional Space Vector Pulse Width Modulation) method for controlling the inverter; therefore, a voltage-type three-phase four-wire inverter based on SVPWM was carried out through defining the vector selections for each of time sequence intervals. To further understand the conventional controllers, the state equations are derived based on the constant three-phase inductance, so that some compensation must be used for overcoming the inadequate inductances, in which the inductances decrease with the increase of the output current; eventually, the whole inverter system is put at risk of system divergence. Moreover, the way of Park Transformation doing in SVPWM is to transform the RST coordinates of three-phase three-wire system to DQ coordinates, or transform the RSTN coordinates of three-phase four-wire system to $\alpha\beta\gamma$ coordinates.

However, because the Park Transformation is completed by taking the voltage signal and current signal of three phases as fundamental sinusoidal functions, harmonic compensator or predictor must be added in to the system for compensating the inadequate transformations, from which the voltage signal or current signal of three phases include harmonic components; eventually, the design of the controller for the inverter system is getting complicated. Besides, since the feedback compensation in the conventional inverter system is designed corresponding to a specific load, the previously designed feedback compensation would become unsuitable, at which a new load differing from the specific load is connected to the inverter.

Accordingly, in view of the conventional inverter controlling methods including obvious drawbacks and shortcomings, the inventor of the proposed approach has made great efforts to make inventive research thereon and eventually provided a load impedance estimation and repetitive control method capable of allowing inductance variation for inverter.

SUMMARY OF THE INVENTION

The primary objective of the present invention is to provide a load impedance estimation and repetitive control method capable of allowing inductance variation for an inverter, wherein the method is applied for predicting corresponding next-period switching duty cycles for four switching member sets of the inverter by way of sampling three phase voltages and calculating next-period voltage compensations based on the previous line-period voltage compensations. Moreover, during the calculation and prediction, the method also involves the inductance variations of the output inductors of the inverter into the load impedance estimation matrix equation. Therefore, the three phases four wires inverter with the presented load impedance estimation and repetitive control method can provide a steady output voltage to the loads even if the originally-connected loads are replaced with other different loads. Thus, this load impedance estimation and repetitive control method can indeed improve the drawbacks of the inverter controller based on conventional DQ transformation method.

Accordingly, to achieve the primary objective of the present invention, the inventor of the present invention provides a load impedance estimation and repetitive control method capable of allowing inductance variation for inverter, comprising steps of:

(1) providing a three-phase four-wire inverter connecting to at least one load, wherein the three-phase four-wire inverter has a R-phase output inductor, an S-phase output inductor, a T-phase output inductor, a N-phase balance inductor, a R-phase output capacitor, an S-phase output capacitor, and a T-phase output capacitor;

(2) deriving a first matrix equation for presenting the voltage variation of the R-phase output inductor, the S-phase output inductor, the T-phase output inductor by using Kirchhoff's current law and voltage law;

(3) measuring a R-phase output voltage, an S-phase output voltage and a T-phase output voltage of the three-phase four-wire inverter for obtaining a signal waveform diagram, and then partitioning the signal waveform diagram into a plurality of phase voltage regions according to the zero voltage crossing points of the R-phase output voltage, the S-phase output voltage and the T-phase output voltage;

(4) modulating a switching periodic signal waveform diagram of a R-phase switching member set, an S-phase switching member set, a T-phase switching member set, and a N-phase switching member set in the three-phase four-wire inverter through a Two Phase Modulation way, so as to make the switching periodic signal waveform diagram show centrally symmetrical;

(5) deriving a plurality of switching duty cycle matrix equations for each of the phase voltage regions through the first matrix equation, and then integrating all the switching duty cycle matrix equations to a second matrix equation;

(6) providing an equivalent RLC load for the at least one load, and then sampling a total current variation of the equivalent RLC load for three periods by using a controller;

(7) deriving a total current variation matrix equation according to the total current variation obtained by the step (6) and Kirchhoff's current law;

(8) using the total current variation matrix equation to estimate a specific resistance, a specific inductance and a specific capacitance for a parallel resistor, a parallel inductor and a parallel capacitor in the equivalent RLC load, respectively;
(9) substituting the specific resistance, the specific inductance and the specific capacitance into the second matrix equation, so as to obtain a next-period switching duty cycle for the R-phase switching member set, the S-phase switching member set, the T-phase switching member set, and the N-phase switching member set; and
(10) the R-phase switching member set, the S-phase switching member set, the T-phase switching member set, and the N-phase switching member set executing switching operations based on the next-period switching duty cycle, such that the three-phase four-wire inverter outputs an output voltage steadily.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIGS. 2A, 2B and 2C show a flow chart of a load impedance estimation and repetitive control method for an inverter according to the present invention;

DETAILED DESCRIPTION OF THE PREFERRED EMBODIMENTS

To more clearly describe a load impedance estimation and repetitive control method capable of allowing inductance variation for inverter according to the present invention, embodiments of the present invention will be described in detail with reference to the attached drawings hereinafter.

Before introducing the load impedance estimation and repetitive control method capable of allowing inductance variation for an inverter, it needs to describe the basic framework of the inverter with three phases and four wires. As the basic framework diagram shown by FIG. 1, the three-phase four-wire inverter 1 consists of: an energy-storing capacitor capable of providing a DC voltage $V_{DC}$, four switching member sets, three output inductors, three output capacitors, wherein three output filtering units are formed by the three output inductors and the three output capacitors, and the three output filtering units are coupled to a R-phase load $Z_R$, a S-phase load $Z_S$ and a T-phase load $Z_T$, respectively.

Figure 1:
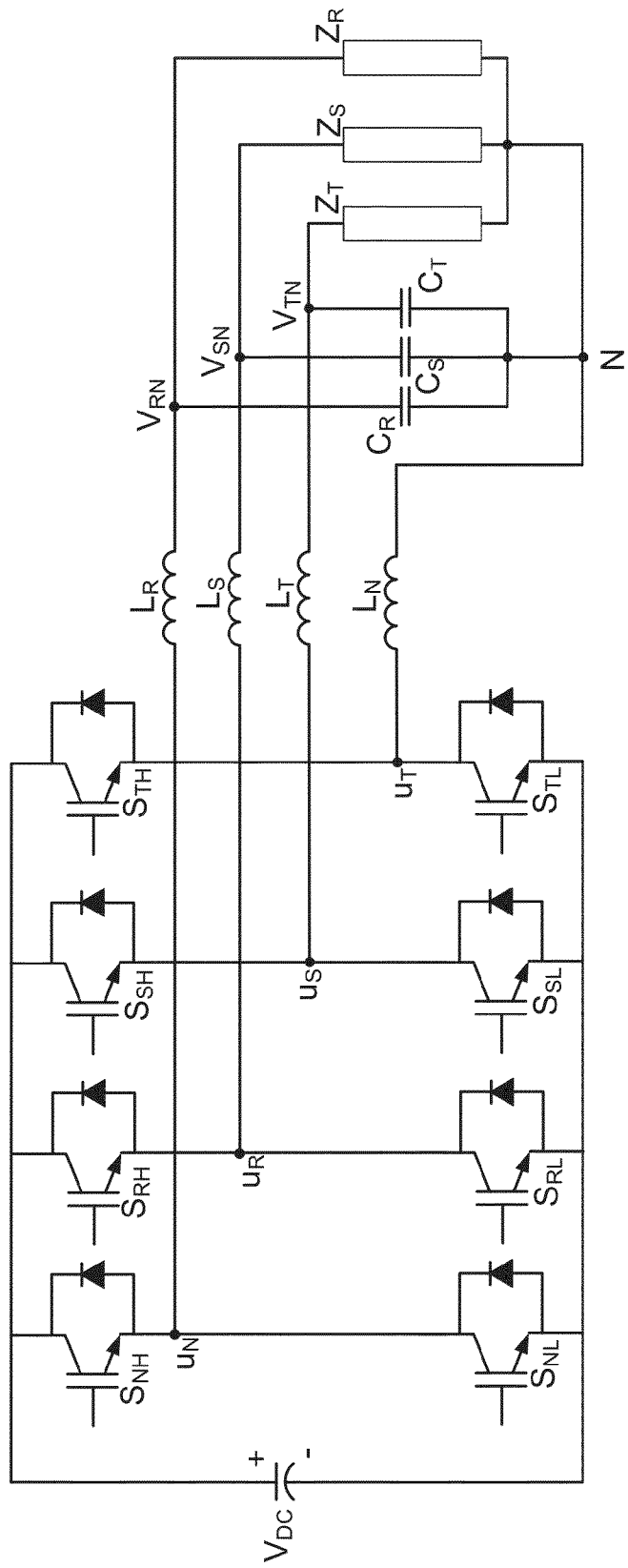
FIG. 1 is a basic framework diagram of a three-phase four-wire inverter.

As shown in FIG. 1, the four switching member sets include a R-phase switching member set ($S_{RH}$, $S_{RL}$), an S-phase switching member set ($S_{SH}$, $S_{SL}$), a T-phase switching member set ($S_{TH}$, $S_{TL}$), and a N-phase switching member set ($S_{NH}$, $S_{NL}$). In addition, the three output inductors include a R-phase output inductor $L_R$, a S-phase output inductor $L_S$ and a T-phase output inductor $L_T$. Besides, the three output capacitors include a R-phase output capacitor $C_R$, a S-phase output capacitor $C_S$ and a T-phase output capacitor $C_T$. Moreover, the three output capacitors ($C_R$, $C_S$, $C_T$) and the three load ($Z_R$, $Z_S$, $Z_T$) have one neutral terminal N, and the neutral terminal N is further coupled to a N-phase balance inductor $L_N$. Herein, it needs to further explain that, the R-phase switching member set in the three-phase four-wire inverter consists of a R-phase upper-arm switching member $S_{RH}$ and R-phase lower-arm switching member $S_{RL}$; similarly, the S-phase switching member set consists of a S-phase upper-arm switching member $S_{SH}$ and S-phase lower-arm switching member $S_{SL}$, the T-phase switching member set consists of a T-phase upper-arm switching member $S_{TH}$ and T-phase lower-arm switching member $S_{TL}$, and the N-phase switching member set consists of a N-phase upper-arm switching member $S_{NH}$ and N-phase lower-arm switching member $S_{NL}$.

Figure 2A:
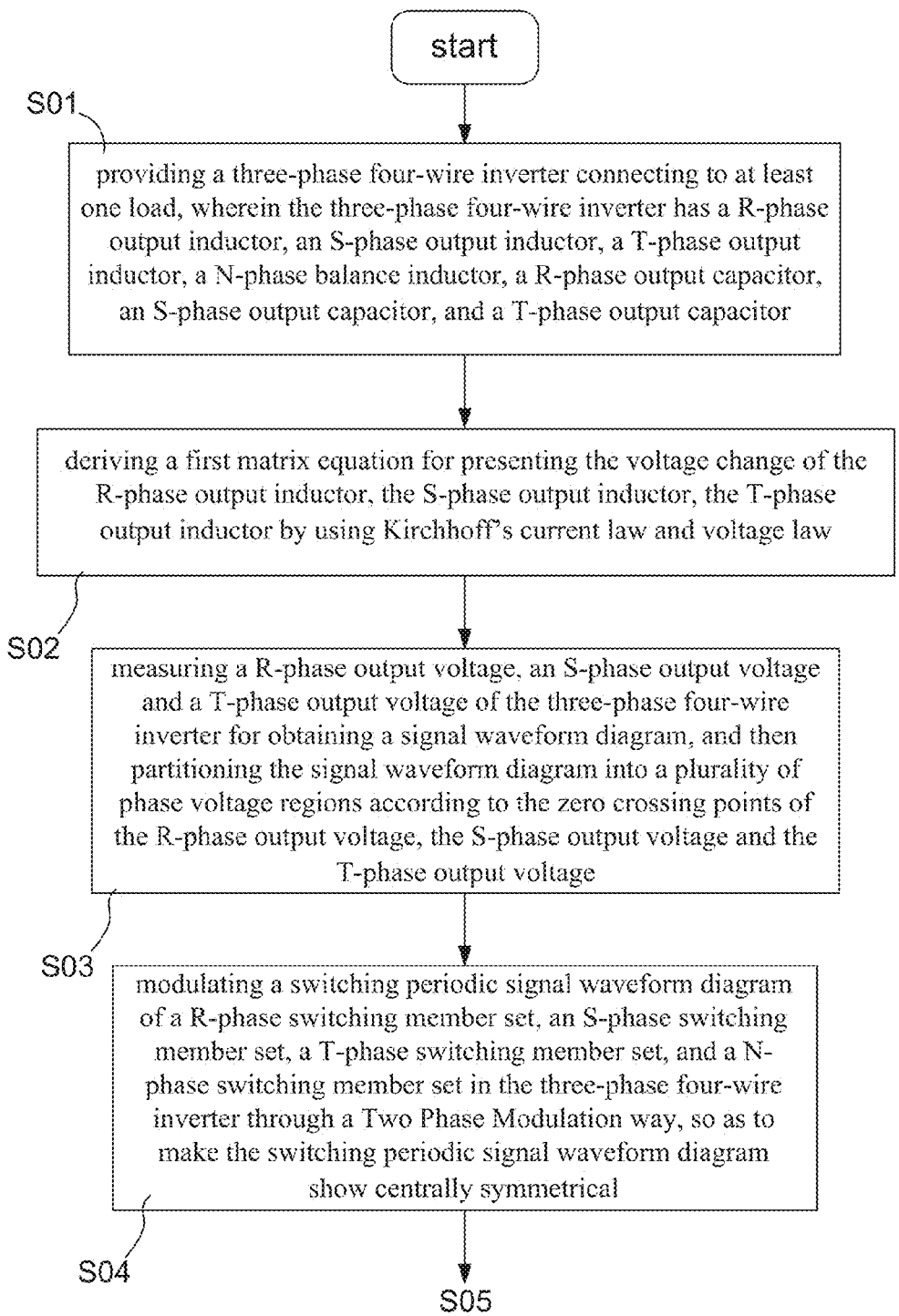
Figure 2B:
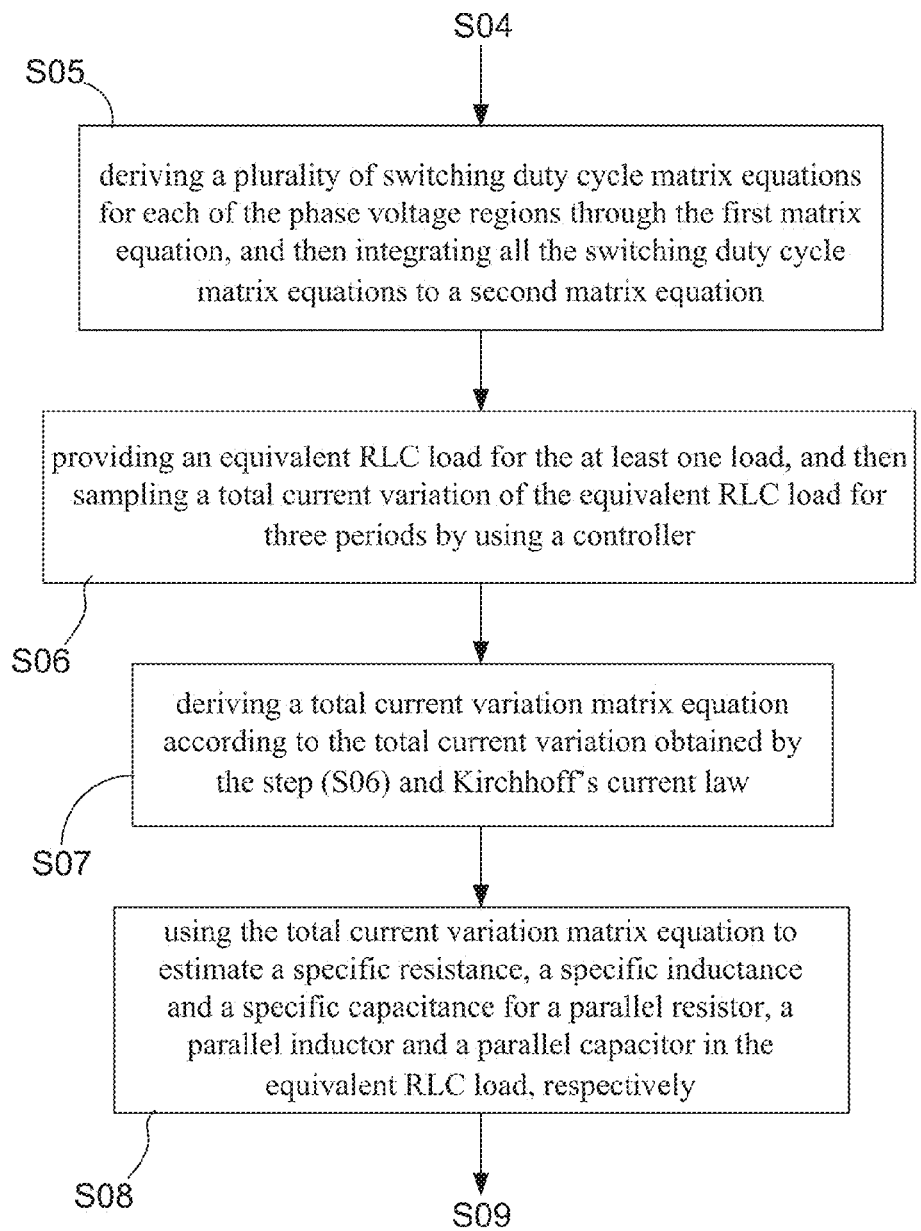
Figure 3:
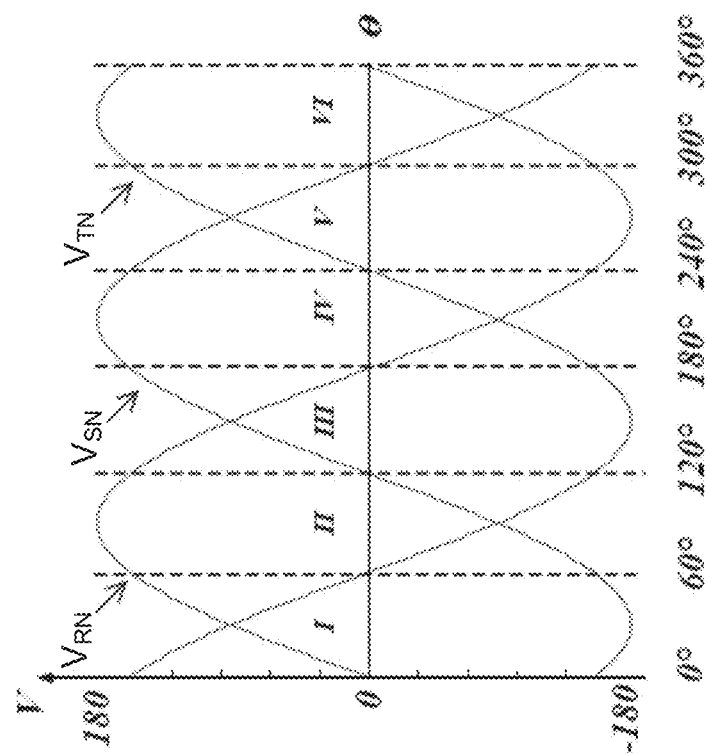
FIG. 3 is signal waveform diagram of three phase voltages of the inverter.

Continuously, please refer to FIGS. 2A, 2B and 2C, which illustrate a flow chart of a load impedance estimation and repetitive control method according to the present invention. As the FIGS. 2A, 2B and 2C show, the load impedance estimation and repetitive control method consists of 10 steps.

First of all, the method proceeds to step (S01) for providing a three-phase four-wire inverter liking the inverter shown by FIG. 1, wherein the three-phase four-wire inverter is connected to at least one load and has a R-phase output inductor $L_R$, an S-phase output inductor $L_S$, a T-phase output inductor $L_T$, a N-phase balance inductor $L_N$, a R-phase output capacitor $C_R$, an S-phase output capacitor $C_S$, and a T-phase output capacitor $C_T$. Next, the method proceeds to step (S02) for deriving a first matrix equation for presenting the voltage variation of the R-phase output inductor $L_R$, the S-phase output inductor $L_S$, the T-phase output inductor $L_T$ by using Kirchhoff's current law (KCL) and Kirchhoff's voltage law (KVL). The first matrix equation is presented as follows:

$$\begin{bmatrix} u_{RN} \\ u_{SN} \\ u_{TN} \end{bmatrix} = \begin{bmatrix} L_R + L_N & L_N & L_N \\ L_N & L_S + L_N & L_N \\ L_N & L_N & L_T + L_N \end{bmatrix} \begin{bmatrix} \dfrac{di_R}{dt} \\ \dfrac{di_S}{dt} \\ \dfrac{di_T}{dt} \end{bmatrix} + \begin{bmatrix} v_{RN} \\ v_{SN} \\ v_{TN} \end{bmatrix}$$

In the first matrix equation, $u_{RN}$, $u_{SN}$ and $u_{TN}$ denote a R-phase switching voltage, a S-phase switching voltage and a T-phase switching voltage for the three-phase four-wire inverter 1, respectively. In addition, $L_R$, $L_S$, $L_T$, and $L_N$ are respectively the inductances of the R-phase output inductor $L_R$, the S-phase output inductor $L_S$, the T-phase output inductor $L_T$, and the N-phase balance inductor $L_N$. Besides, $i_R$, $i_S$, $i_T$ are respectively the inductor currents of the R-phase output inductor $L_R$, the S-phase output inductor $L_S$ and the T-phase output inductor $L_T$. Furthermore, $V_{RN}$, $V_{SN}$ and $V_{TN}$ denote the voltage values of a R-phase output voltage, an S-phase output voltage and a T-phase output voltage of the three-phase four-phase inverter 1.

After obtaining the first matrix equation, the method continuously proceeds to step (S03) for measuring a R-phase output voltage ($V_{RN}$), an S-phase output voltage ($V_{SN}$) and a T-phase output voltage ($V_{TN}$) of the three-phase four-wire inverter 1 for obtaining a signal waveform diagram, and then partitioning the signal waveform diagram into 6 phase voltage regions (I, II, III, IV, V, VI) according to the zero voltage crossing points of the R-phase output voltage ($V_{RN}$), the S-phase output voltage ($V_{SN}$) and the T-phase output voltage ($V_{TN}$).

Subsequently, the method proceeds to step (S04) for modulating a switching periodic signal waveform diagram of the R-phase switching member set ($S_{RH}$, $S_{RL}$), the S-phase switching member set ($S_{SH}$, $S_{SL}$), the T-phase switching member set ($S_{TH}$, $S_{TL}$), and the N-phase switching member set ($S_{NH}$, $S_{NL}$) in the three-phase four-wire inverter 1 through a Two Phase Modulation (TPM) way, so as to make the switching periodic signal waveform diagram show centrally symmetrical. In the load impedance estimation and repetitive control method, the step (S04) includes a plurality of detailed steps, and these detailed steps will be clearly introduced in following paragraphs.

Figure 4A:
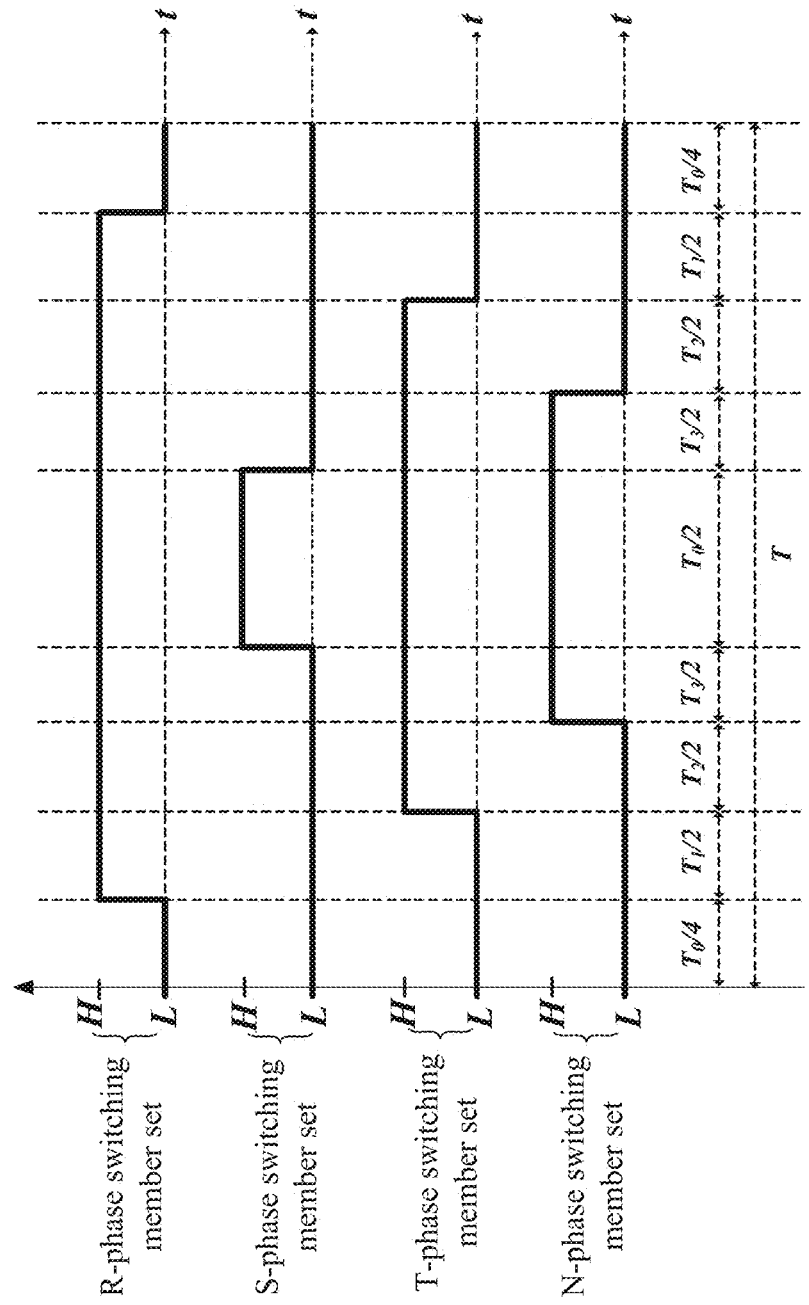
FIGS. 4A, 4B, 4C, 4D, and 4E show schematic operation diagrams of Two Phase Modulation (TPM)
Figure 4B:
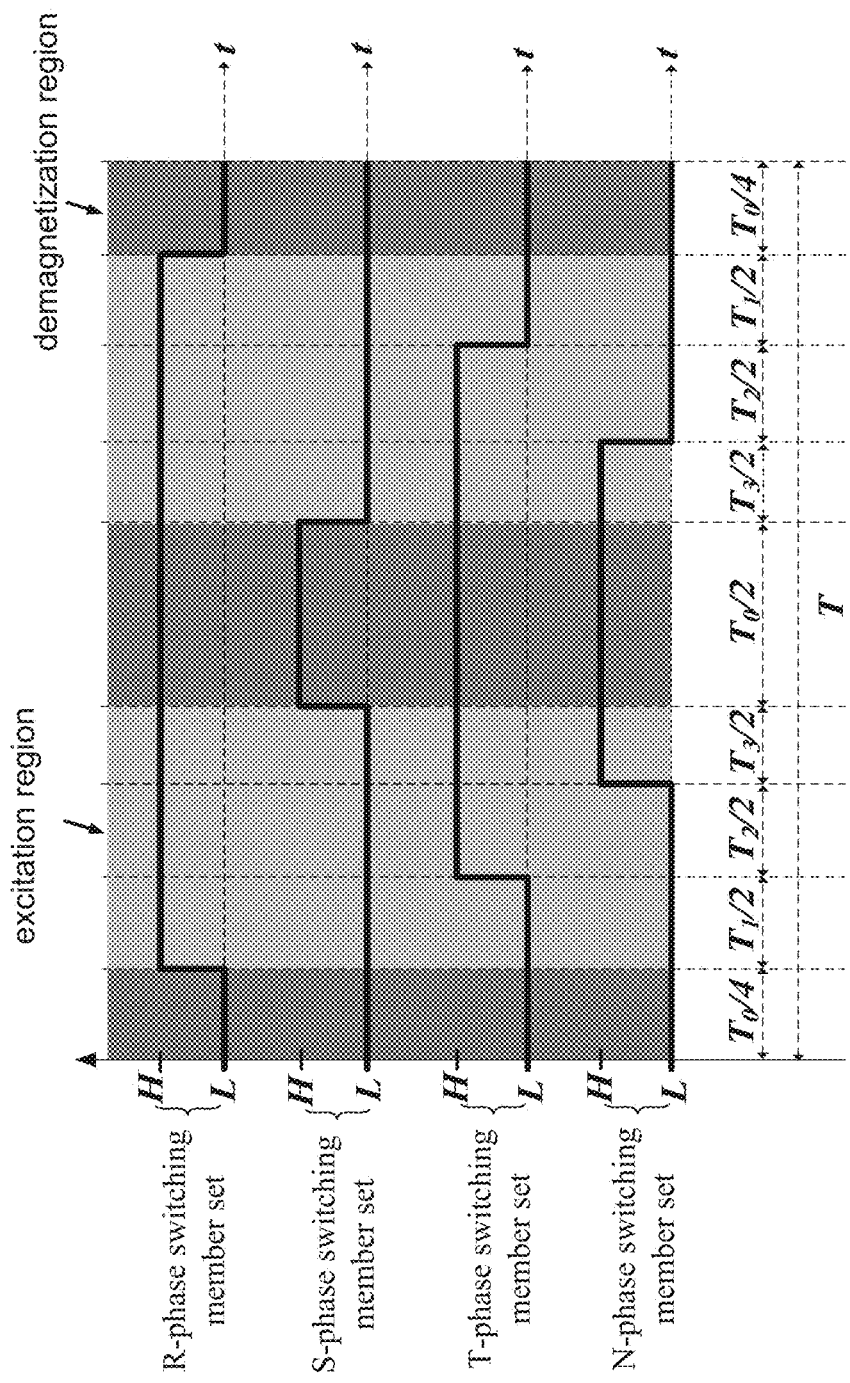

Please refer to FIGS. 4A, 4B, 4C, 4D, and 4E, which show schematic TPM operation diagrams. As shown in FIG. 4A, a plurality of switching timing intervals can be obtained after analyzing a switching timing diagram of the R-phase switching member set ($S_{RH}$, $S_{RL}$), the S-phase switching member set ($S_{SH}$, $S_{SL}$), the T-phase switching member set ($S_{TH}$, $S_{TL}$), and the N-phase switching member set ($S_{NH}$, $S_{NL}$) and treating a partition process to the switching timing diagram. Next, as shown in FIG. 4B, the switching timing intervals are set to be a plurality of light-coloured excitation regions and a plurality of dark-coloured demagnetization regions, wherein the excitation regions consist of the (HHHH) region and the (LLLL) region. Moreover, the demagnetization regions consist of the (HLLL) region, the (HLHL) region and the (HLHH) region in the first switching timing interval $T_1$, the second switching timing interval $T_2$ and the third switching timing interval $T_3$; wherein $T_0 = T - T_1 - T_2 - T_3$, and T is the switching period of the R-phase switching member set ($S_{RH}$, $S_{RL}$), S-phase switching member set ($S_{SH}$, $S_{SL}$), T-phase switching member set ($S_{TH}$, $S_{TL}$), and N-phase switching member set ($S_{NH}$, $S_{NL}$).

Figure 4C:
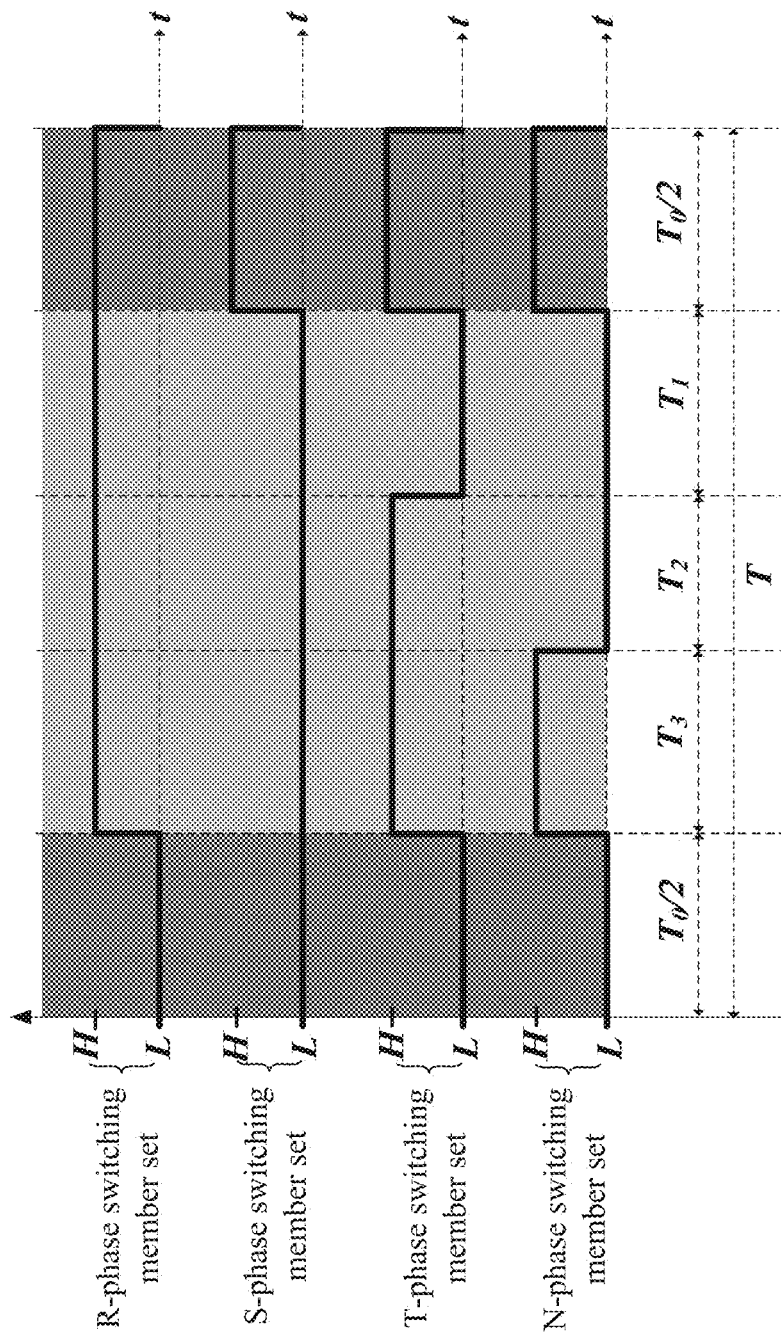
Figure 4D:
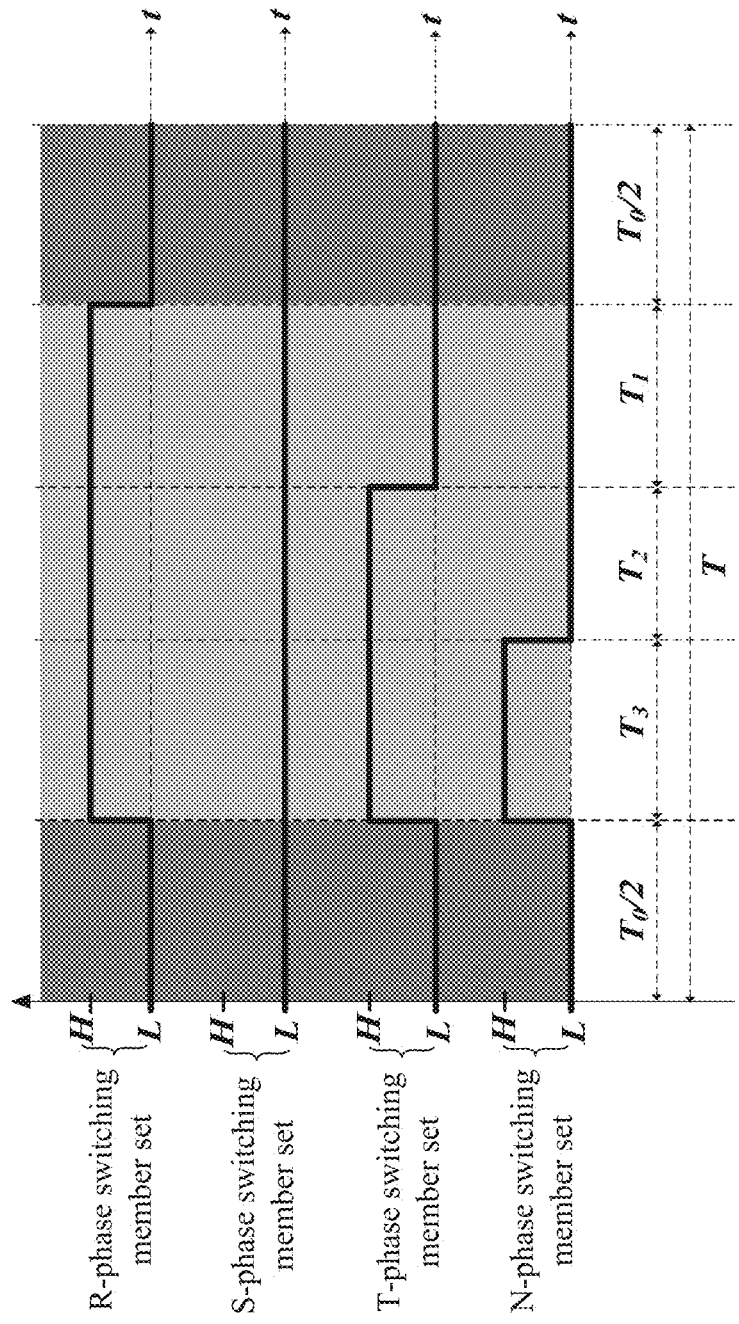
Figure 4E:
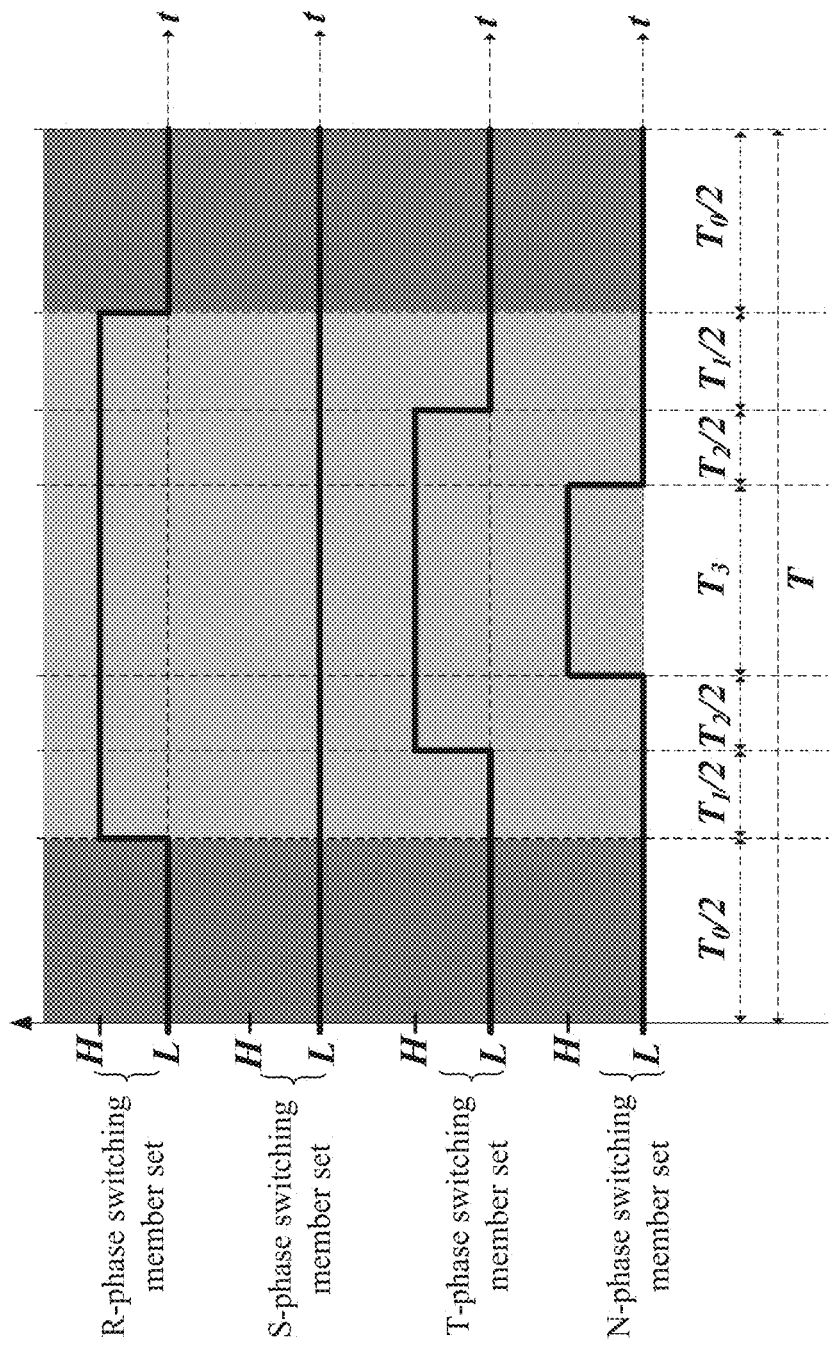

As shown in FIG. 4C, the light-coloured excitation regions are subsequently integrated and moved the to the center of the switching timing diagram; after that, as shown in FIG. 4D, all the high-level signals in the dark-coloured demagnetization regions are switched to low-level signals; i.e., transforming the (HHHH) in a demagnetization region to (LLLL). Because both the (HHHH) region and the (LLLL) region belong to demagnetization region, the (HHHH)-to-(LLLL) transformation would not affect the normal operation of the three-phase four-wire inverter 1.

After completing the step (S04), the method proceeds to step (S05) for deriving a plurality of switching duty cycle matrix equations for each of the phase voltage regions (I, II, III, IV, V, VI) through the first matrix equation, and then integrating all the switching duty cycle matrix equations to a second matrix equation. The switching duty cycle matrix equation is presented as follows:

$$\begin{bmatrix} D_{RH} \\ D_{TH} \\ D_{NH} \end{bmatrix} = \begin{bmatrix} \dfrac{L_R \Delta i_R - L_S \Delta i_S}{V_{DC}T} \\ \dfrac{-L_S \Delta i_S + L_T \Delta i_T}{V_{DC}T} \\ \dfrac{-L_N \Delta i_R - (L_S + L_N) \Delta i_S - L_N \Delta i_T}{V_{DC}T} \end{bmatrix} + \begin{bmatrix} \dfrac{V_{RS}}{V_{DC}} \\ \dfrac{-V_{ST}}{V_{DC}} \\ \dfrac{-V_{SN}}{V_{DC}} \end{bmatrix}$$

In the switching duty cycle matrix equation, $D_{RH} = (T_1 + T_2 + T_3)/T$, $D_{TH} = (T_2 + T_3)/T$ and $D_{NH} = (T_3)/T$. Moreover, $\Delta i_R$, $\Delta i_S$ and $\Delta i_T$ are respectively the inductor current variation of the R-phase output inductor $L_R$, S-phase output inductor $L_S$ and T-phase output inductor $L_C$, and $V_{DC}$ is the DC input voltage of the three-phase four-wire inverter 1. In addition, $V_{RS}$ means the voltage difference between the R-phase output voltage and S-phase output voltage, $V_{ST}$ means the voltage difference between the S-phase output voltage and T-phase output voltage, and $V_{SN}$ means the voltage difference between the S-phase output voltage and N-phase output voltage. In the present invention, $T_1$, $T_2$ and $T_3$ can be calculated by using following formula:

$$\begin{bmatrix} T_1 \\ T_2 \\ T_3 \end{bmatrix} = \begin{bmatrix} \dfrac{1}{V_{DC}} & 0 & -\dfrac{1}{V_{DC}} \\ 0 & 0 & \dfrac{1}{V_{DC}} \\ 0 & -\dfrac{1}{V_{DC}} & 0 \end{bmatrix} \begin{bmatrix} L_R + L_N & L_N & L_N \\ L_N & L_S + L_N & L_N \\ L_N & L_N & L_T + L_N \end{bmatrix}$$

$$\begin{bmatrix} \Delta i_R \\ \Delta i_S \\ \Delta i_T \end{bmatrix} + \begin{bmatrix} \dfrac{1}{V_{DC}} & 0 & -\dfrac{1}{V_{DC}} \\ 0 & 0 & \dfrac{1}{V_{DC}} \\ 0 & -\dfrac{1}{V_{DC}} & 0 \end{bmatrix} \begin{bmatrix} V_{RN} \\ V_{SN} \\ V_{TN} \end{bmatrix} T$$

Moreover, the second matrix equation is presented as follows:

$$\begin{bmatrix} D_A(n+1) \\ D_B(n+1) \\ D_N(n+1) \end{bmatrix} =$$

$$\dfrac{1}{V_{DC}T} \begin{bmatrix} L_A & -L_C & 0 \\ 0 & L_B & -L_C \\ -L_N & -L_N & -(L_N + L_C) \end{bmatrix} \begin{bmatrix} (-1)^{r-1} \Delta i_A(n+1) \\ (-1)^{r-1} \Delta i_B(n+1) \\ (-1)^{r-1} \Delta i_N(n+1) \end{bmatrix} + \begin{bmatrix} D_{AF}(n+1) \\ D_{BF}(n+1) \\ D_{NF}(n+1) \end{bmatrix}$$

In the second matrix equation, $D_A(n+1)$ and $D_B(n+1)$ means two next-period switching duty cycles for any two switching member sets in the R-phase switching member set ($S_{RH}$, $S_{RL}$), S-phase switching member set ($S_{SH}$, $S_{SL}$), and T-phase switching member set ($S_{TH}$, $S_{TL}$). Moreover, $D_N(n+1)$ means the next-period switching duty cycle for the N-phase switching member set ($S_{NH}$, $S_{NL}$). Besides, r denotes to any one phase voltage region (I, II, III, IV, V, VI) and is an integer ranged between 1-6. In addition, $\Delta i_A(n+1)$ and $\Delta i_B(n+1)$ are two next-period inductor current variations for any two output inductors in the R-phase output inductor $L_R$, S-phase output inductor $L_S$ and T-phase output inductor $L_T$, and $\Delta i_N(n+1)$ is the next-period inductor current variation for the N-phase balance inductor $L_N$. Furthermore, $D_{AF}(n+1)$ and $D_{BF}(n+1)$ are respectively two modulated duty cycles for ant two phases in the R-phase, the S-phase and the T-phase of the three-phase four-wire inverter 1, and $D_{NF}(n+1)$ is the modulated duty cycle for the N-phase of the three-phase four-wire inverter 1.

Figure 5:
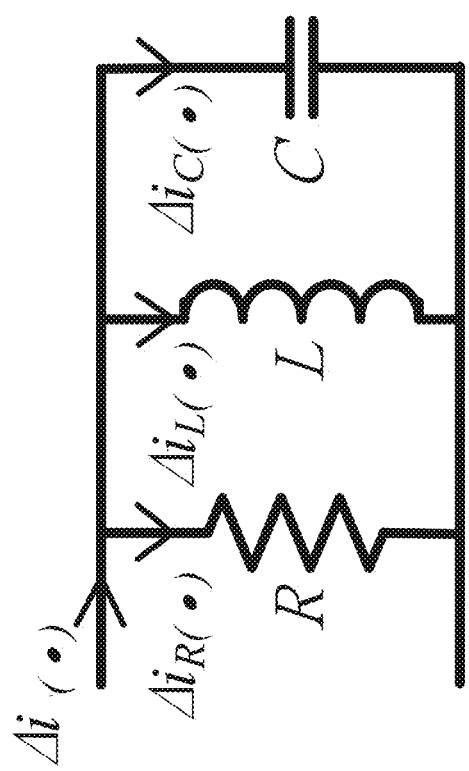
FIG. 5 is a circuit diagram of an equivalent RLC load.

After the second matrix equation is obtained, the method is continuously proceeds to step (S06) for providing an equivalent RLC load for the at least one load, and then sampling a total current variation of the equivalent RLC load for three periods by using a controller. Therefore, in step (S07), a total current variation matrix equation can be derived according to the total current variation obtained by the step (S06) and Kirchhoff's current law. Through the equivalent RLC load shown by FIG. 5, a current formula of $\Delta i_{(\cdot)}(n+1)=\Delta i_{R(\cdot)}+\Delta i_{L(\cdot)}+\Delta i_{C(\cdot)}$, wherein "." in the current formula means "R", "S" or "T", and (n+1) means next period. Moreover, $\Delta i_{R(\cdot)}$, $\Delta i_{L(\cdot)}$, and $\Delta i_{C(\cdot)}$ respectively denote to a resistor current variation of a parallel resistor, a inductor current variation of a parallel inductor, and a capacitor current variation of a parallel capacitor in the equivalent RLC load. Thus, the summation of $\Delta i_{R(\cdot)}$, $\Delta i_{L(\cdot)}$ and $\Delta i_{C(\cdot)}$ is the total current variation of the equivalent RLC load. Then, the total current variation matrix equation can be derived after recording the total current variation for three periods. The total current variation matrix equation is presented as follows:

$$\begin{bmatrix} \Delta i_{v(\bullet)}(n-1) \\ \Delta i_{v(\bullet)}(n-2) \\ \Delta i_{v(\bullet)}(n-3) \end{bmatrix} = \begin{bmatrix} \Delta v_R(n-1) & \Delta v_C(n-1) & \Delta v_L(n-1) \\ \Delta v_R(n-2) & \Delta v_C(n-2) & \Delta v_L(n-2) \\ \Delta v_R(n-3) & \Delta v_C(n-3) & \Delta v_L(n-3) \end{bmatrix} \cdot \begin{bmatrix} k_{pR} \\ k_{pC} \\ k_{pL} \end{bmatrix}$$

In the current variation matrix equation, $\Delta i_{V(\cdot)}(n-1)$, $\Delta i_{V(\cdot)}(n-2)$ and $\Delta i_{V(\cdot)}(n-3)$ are respectively the total current variation of the equivalent RLC load in three periods. Moreover, $\Delta v_R(n-1)$, $\Delta v_R(n-2)$ and $\Delta v_R(n-3)$ are respectively the voltage variations on the parallel resistor of the equivalent RLC load in three periods, and $k_{pR}$ being the reciprocal of the specific resistance of the parallel resistor. In addition, $\Delta v_C(n-1)$, $\Delta v_C(n-2)$ and $\Delta v_C(n-3)$ are respectively the voltage variations on the parallel capacitor of the equivalent RLC load in three periods, and $k_{pc}$ can be calculated by way of dividing the specific capacitance of the parallel capacitor by 2 T. Besides, $\Delta v_L(n-1)$, $\Delta v_L(n-2)$ and $\Delta v_L(n-3)$ are respectively the voltage variations on the parallel inductor of the equivalent RLC load in three periods, and $k_{pL}$ is equal to T/2 L, wherein L is the specific inductance of the parallel inductor.

Completing the derivation of the total current variation matrix equation and the record of three-period total current variation, it is able to subsequently execute step (S08) for using the total current variation matrix equation to respectively estimate a specific resistance, a specific inductance and a specific capacitance for the parallel resistor, the parallel inductor and the parallel capacitor in the equivalent RLC load. Furthermore, in step (S09), a next-period switching duty cycle for the R-phase switching member set ($S_{RH}$, $S_{RL}$), the S-phase switching member set ($S_{SH}$, $S_{SL}$), the T-phase switching member set (S, $S_{TL}$), and the N-phase switching member set ($S_{NH}$, $S_{NL}$) can be therefore obtained by substituting the specific resistance, the specific inductance and the specific capacitance into the second matrix equation.

The aforesaid step (S09) includes two detailed steps. First of all, it calculates a resistor current variation of the parallel resistor, an inductor current variation of the parallel inductor, a capacitor current variation of the parallel capacitor according to the specific resistance, the specific inductance and the specific capacitance obtained by the step (S08), respectively. Therefore, the calculated resistor current variation, the inductor current variation and the capacitor current variation is substituted into the second matrix equation, and then the next-period switching duty cycle for the R-phase switching member set ($S_{RH}$, $S_{RL}$), the S-phase switching member set ($S_{SH}$, $S_{SL}$), the T-phase switching member set ($S_{TH}$, $S_{TL}$), and the N-phase switching member set ($S_{NH}$, $S_{NL}$) can be calculated. Herein, it needs to further explain that, the first detailed step of the step (S09) is accomplished by using following 3 current formulas:

current formula (1):

$$\Delta i_{R(\bullet)}(n+1) = \frac{\Delta v_R(n+1)}{R} = \frac{v_{ref(\bullet)}(n+1) - v_{fb(\bullet)}(n)}{R}$$

current formula (2):

$$\Delta i_C(n+1) = \frac{C}{2 \cdot T_s} \Delta v_C(n+1) = \frac{C}{2 \cdot T_s} \cdot [v_{ref}(n+2) - v_{ref}(n+1) - v_{fb}(n) + v_{fb}(n-1)]$$

current formula (3):

$$\Delta i_{L(\bullet)}(n+1) = \frac{\Delta v_L(n+1)}{2L} = \frac{v_{ref(\bullet)}(n+1) + v_{fb(\bullet)}(n)}{2L} \cdot T$$

In aforesaid current formulas, $V_{ref(\cdot)}$ and $V_{fb(\cdot)}$ mean a sinusoidal reference voltage and a feedback voltage, respectively. Thus, after substituting the calculated resistor current variation, the inductor current variation and the capacitor current variation into the second matrix equation, the next-period switching duty cycle for the R-phase switching member set ($S_{RH}$, $S_{RL}$), the S-phase switching member set ($S_{SH}$, $S_{SL}$), the T-phase switching member set ($S_{TH}$, $S_{TL}$), and the N-phase switching member set ($S_{NH}$, $S_{NL}$) is then obtained.

For accelerating the calculation speed of above-mentioned next-period switching duty cycle, a look-up table integrating with all $D_{AF}(n+1)$, $D_{BF}(n+1)$ and $D_{NF}(n+1)$ corresponding to 6 phase voltage region (I, II, III, IV, V, VI) is presented as follows.

Look-Up Table

| Region | A | B | C | $D_{AF}$ | $D_{BF}$ | $D_{NF}$ | r | $S_{RH}$ | $S_{RL}$ | $S_{SH}$ | $S_{SL}$ | $S_{TH}$ | $S_{TL}$ | $S_{NH}$ | $S_{NL}$ |
|---|---|---|---|---|---|---|---|---|---|---|---|---|---|---|---|
| I (0°~60°) | R | T | S | $\frac{V_{RS}}{V_{DC}}$ | $-\frac{V_{ST}}{V_{DC}}$ | $-\frac{V_{SN}}{V_{DC}}$ | 1 | $D_{RH}$ | $\overline{D_{RH}}$ | 0 | 1 | $D_{TH}$ | $\overline{D_{TH}}$ | $D_{NH}$ | $\overline{D_{NH}}$ |
| II (60°~120°) | T | S | R | $-\frac{V_{TR}}{V_{DC}}$ | $\frac{V_{RS}}{V_{DC}}$ | $\frac{V_{RN}}{V_{DC}}$ | 2 | 1 | 0 | $\overline{D_{SL}}$ | $D_{SL}$ | $\overline{D_{TL}}$ | $D_{TL}$ | $\overline{D_{NL}}$ | $D_{NL}$ |
| III (120°~180°) | R | S | T | $-\frac{V_{TR}}{V_{DC}}$ | $\frac{V_{ST}}{V_{DC}}$ | $-\frac{V_{TN}}{V_{DC}}$ | 3 | $D_{RH}$ | $\overline{D_{RH}}$ | $D_{SH}$ | $\overline{D_{SH}}$ | 0 | 1 | $D_{NH}$ | $\overline{D_{NH}}$ |

-continued

| Region | A | B | C | $D_{AF}$ | $D_{BF}$ | $D_{NF}$ | r | $S_{RH}$ | $S_{RL}$ | $S_{SH}$ | $S_{SL}$ | $S_{TH}$ | $S_{TL}$ | $S_{NH}$ | $S_{NL}$ |
|---|---|---|---|---|---|---|---|---|---|---|---|---|---|---|---|
| IV (180°~240°) | R | T | S | $-\dfrac{V_{RS}}{V_{DC}}$ | $\dfrac{V_{ST}}{V_{DC}}$ | $\dfrac{V_{SN}}{V_{DC}}$ | 4 | $\overline{D_{RL}}$ | $D_{RL}$ | 1 | 0 | $\overline{D_{TL}}$ | $D_{TL}$ | $\overline{D_{NH}}$ | $D_{NH}$ |
| V (240°~300°) | T | S | R | $-\dfrac{V_{RS}}{V_{DC}}$ | $\dfrac{V_{TR}}{V_{DC}}$ | $\dfrac{V_{RN}}{V_{DC}}$ | 5 | 0 | 1 | $D_{TH}$ | $\overline{D_{TH}}$ | $D_{SH}$ | $\overline{D_{SH}}$ | $D_{NH}$ | $\overline{D_{NH}}$ |
| VI (300°~360°) | R | S | T | $\dfrac{V_{TR}}{V_{DC}}$ | $-\dfrac{V_{ST}}{V_{DC}}$ | $\dfrac{V_{TN}}{V_{DC}}$ | 6 | $\overline{D_{RL}}$ | $D_{RL}$ | $\overline{D_{SL}}$ | $D_{SL}$ | 1 | 0 | $\overline{D_{NH}}$ | $D_{NH}$ |

In the above-presented look-up table, C denotes any one phase of the R phase, the S phase or the T phase which is at a fully turn-on situation or a fully turn-off situation. For instance, as the region-I row of the look-up table shows, the upper-arm switching member $S_{SH}$ of the S-phase switching member set is at the fully turn-on situation, moreover, the lower-arm switching member $S_{SL}$ of the S-phase switching member set is at the fully turn-off situation base on complementary switching principle. So that, it can find that: each of the phase voltage regions (I, II, III, IV, V, VI) have at least one phase (R phase, S phase or T phase) being operated at the fully turn-on situation or the fully turn-off situation.

Eventually, in step (S10), the R-phase switching member set ($S_{RH}$, $S_{RL}$), the S-phase switching member set ($S_{SH}$, $S_{SL}$), the T-phase switching member set ($S_{TH}$, $S_{TL}$), and the N-phase switching member set ($S_{NH}$, $S_{NL}$) execute their switching operations based on the corresponding next-period switching duty cycles, such that the three-phase four-wire inverter 1 outputs an output voltage steadily.

Figure 6A:
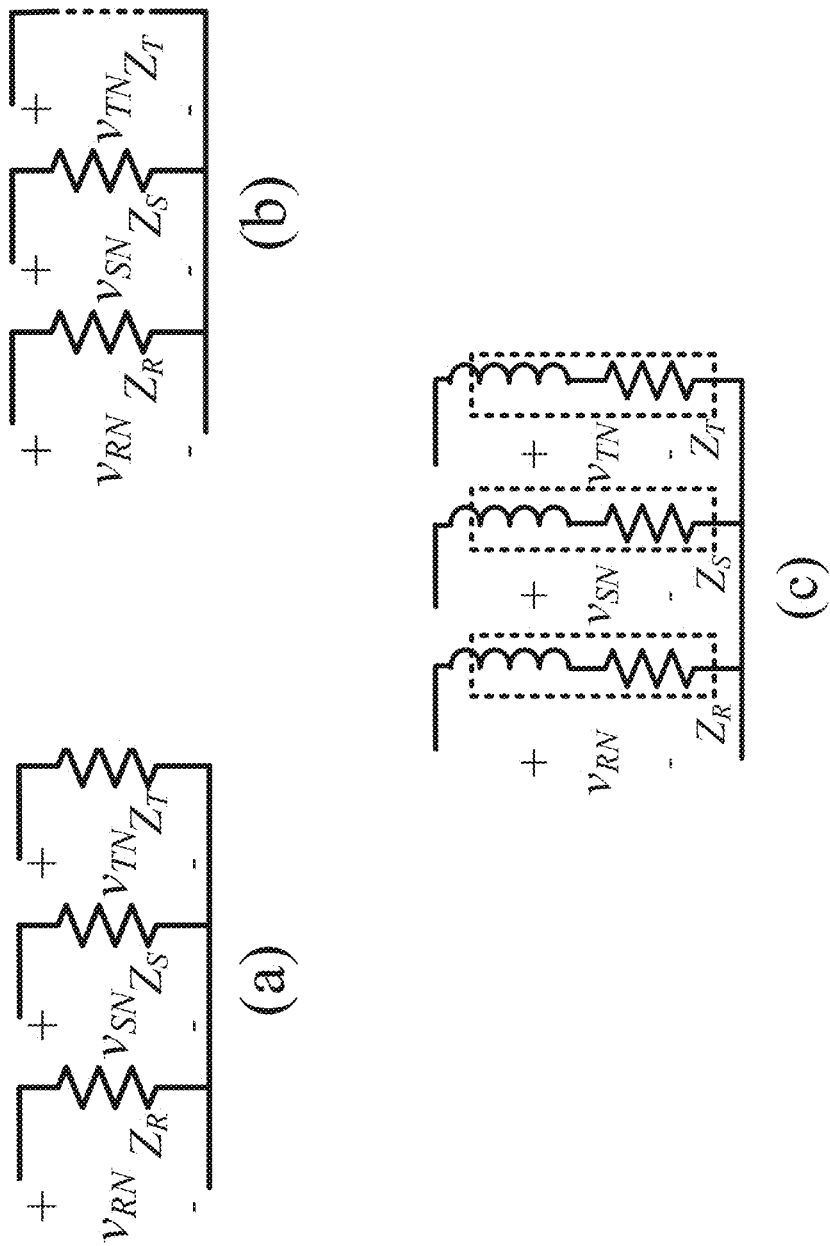
FIG. 6A and FIG. 6B show 5 circuit diagrams for the equivalent RLC load.
Figure 6B:
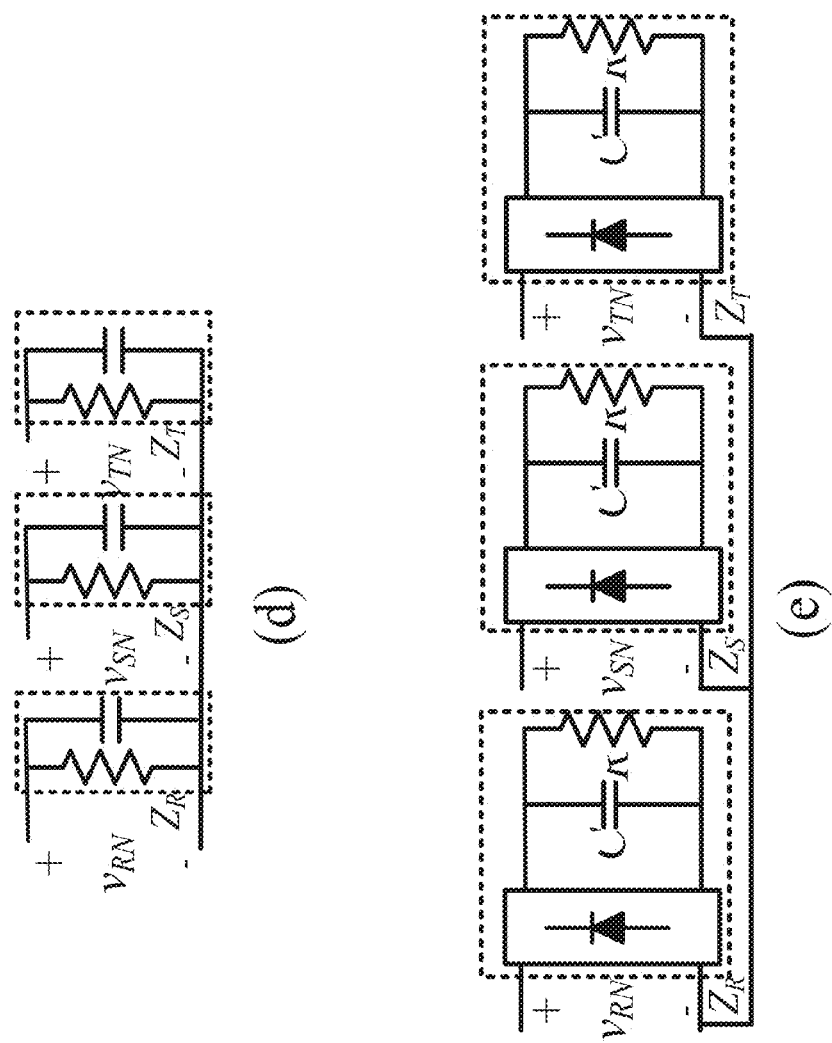
Figure 7:
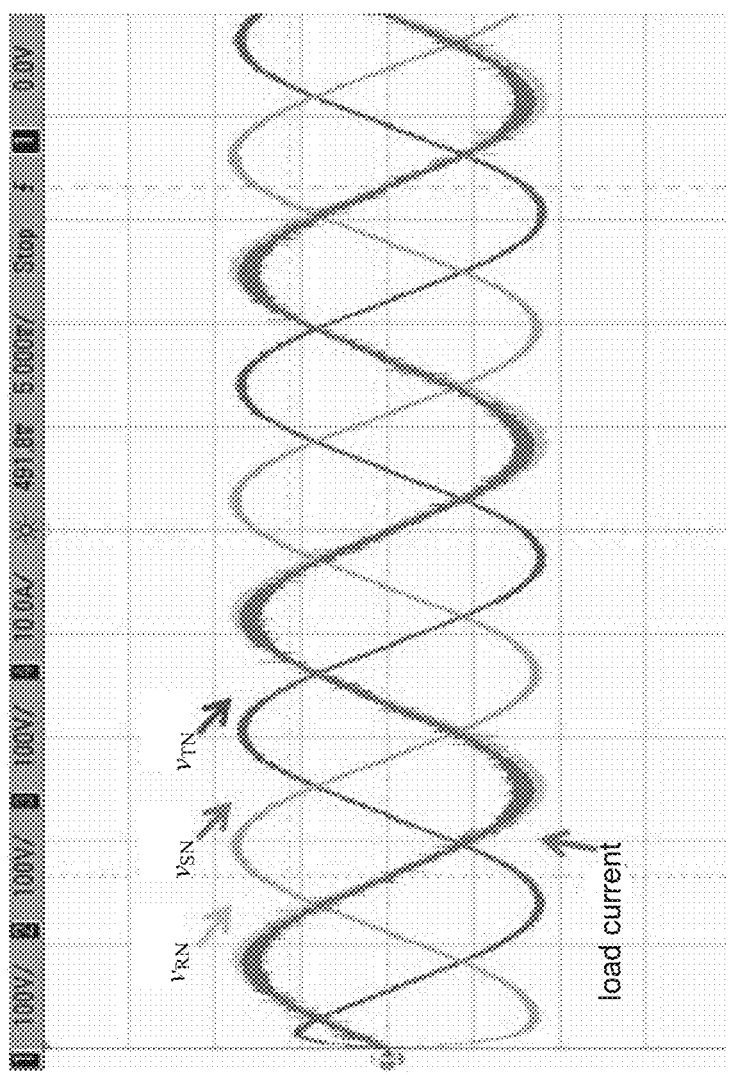
FIG. 7 is a waveform diagram of the R-phase output voltage, the S-phase output voltage, the T-phase output voltage, and the load current measured under 5 kW output power.
Figure 8:
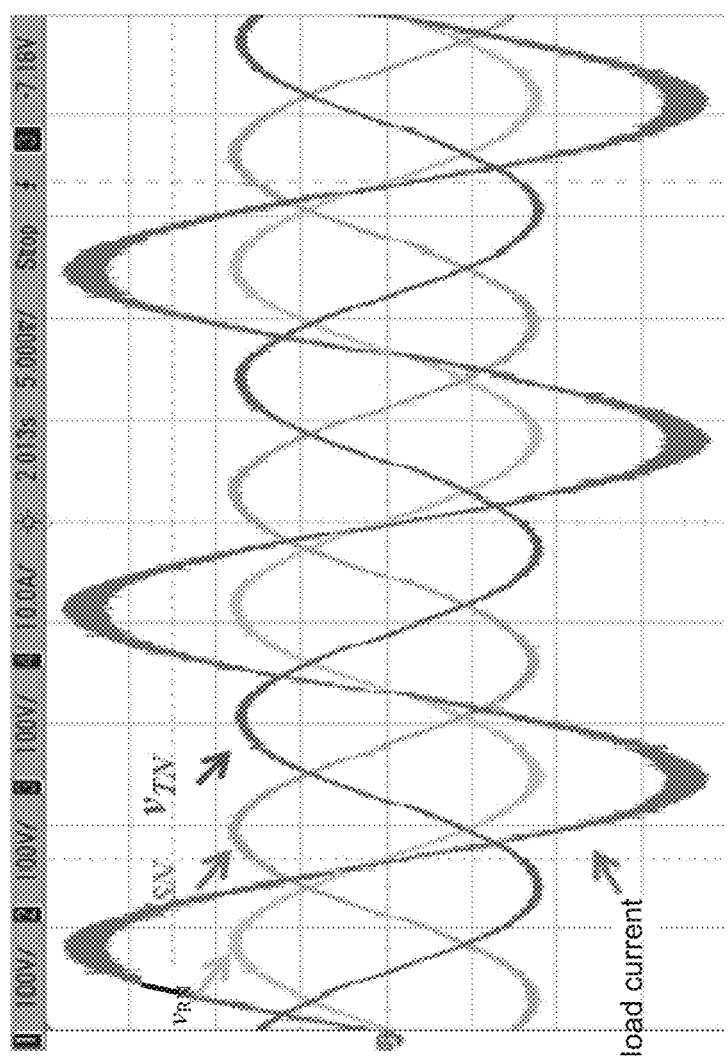
FIG. 8 is the signal waveform diagram of the R-phase output voltage, the S-phase output voltage, the T-phase output voltage, and the load current measured under 10 kW output power.

In order to prove that the load impedance estimation and repetitive control method proposed by the present invention can indeed make the three-phase four-wire inverter output an output voltage steadily, a variety of experiment data are presented as follows. Please refer to FIG. 6A and FIG. 6B, which illustrate 5 circuit diagrams for the equivalent RLC load; moreover, please simultaneously refer to FIG. 7, which show the waveform diagram of the R-phase output voltage ($v_{RN}$), the S-phase output voltage ($v_{SN}$), the T-phase output voltage ($v_{TN}$), and the load current measured under 5 kW output power. As shown in FIG. 7, even if the originally-connected loads are replaced by other different loads, the three-phase four-wire inverter 1 still can provide a steady output voltage to the connected loads. Furthermore, please refer to FIG. 8, which show the waveform diagram of the R-phase output voltage ($v_{RN}$), the S-phase output voltage ($v_{SN}$), the T-phase output voltage ($v_{TN}$), and the load current measured under 10 kW output power. As shown in FIG. 8, similarly, the three-phase four-wire inverter 1 still can provide a steady output voltage to the connected loads even if the originally-connected loads are replaced by other different loads.

Figure 9:
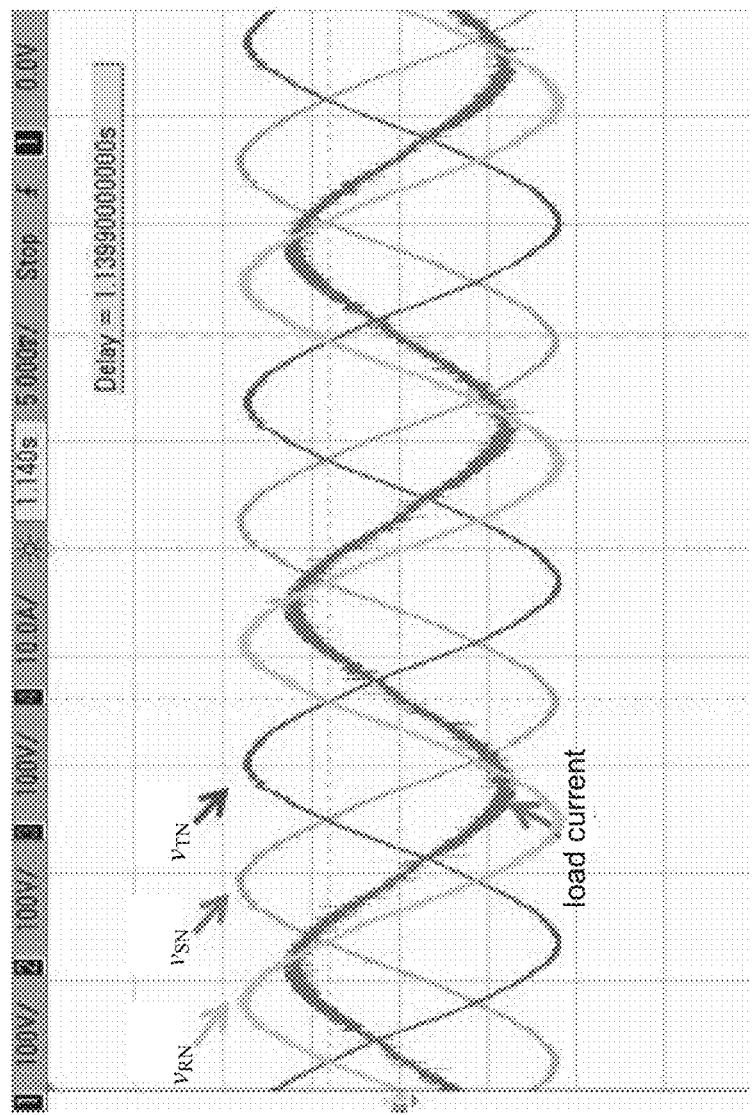
FIG. 9 is a waveform diagram of the R-phase output voltage, the S-phase output voltage, the T-phase output voltage, and the load current.

Besides, please refer to FIG. 9, which show the waveform diagram of the R-phase output voltage ($v_{RN}$), the S-phase output voltage ($v_{SN}$), the T-phase output voltage ($v_{TN}$), and the load current. As shown in FIG. 9, when the inverter 1 connects with a non-linear load, the total harmonic distortion ($V_{THD}$) of the R-phase output voltage ($v_{RN}$), the S-phase output voltage ($v_{SN}$), the T-phase output voltage ($v_{TN}$) is smaller than 1.4%; moreover, all the waveforms of the R-phase output voltage ($v_{RN}$), the S-phase output voltage ($v_{SN}$), the T-phase output voltage ($v_{TN}$) are still a sinusoidal wave.

Therefore, through above descriptions, the load impedance estimation and repetitive control method capable of allowing inductance variation for inverter proposed by the present invention has been introduced completely and clearly; in summary, the present invention includes the primary advantages of: the present invention's method is applied for predicting corresponding next-period switching duty cycles for four switching member sets of the inverter by way of sampling three phase voltages and calculating next-period voltage compensations based on the previous line-period voltage compensations. Moreover, during the calculation and prediction, the method also involves the inductance variations of the output inductors of the inverter into the load impedance estimation matrix equation. Therefore, the three phases four wires inverter with the presented load impedance estimation and repetitive control method can provide a steady output voltage to the loads even if the originally-connected loads are replaced with other different loads. Thus, this load impedance estimation and repetitive control method can indeed improve the drawbacks of the inverter controller based on conventional DQ transformation method.

The above description is made on embodiments of the present invention. However, the embodiments are not intended to limit scope of the present invention, and all equivalent implementations or alterations within the spirit of the present invention still fall within the scope of the present invention.

What is claimed is:

1. A load impedance estimation and repetitive control method capable of allowing inductance variation for inverter, comprising steps of:
   (1) providing a three-phase four-wire inverter connecting to at least one load, wherein the three-phase four-wire inverter has a R-phase output inductor, an S-phase output inductor, a T-phase output inductor, a N-phase balance inductor, a R-phase output capacitor, an S-phase output capacitor, and a T-phase output capacitor;
   (2) deriving a first matrix equation for presenting the voltage variation of the R-phase output inductor, the S-phase output inductor, the T-phase output inductor by using Kirchhoff's current law and voltage law;
   (3) measuring a R-phase output voltage, an S-phase output voltage and a T-phase output voltage of the three-phase four-wire inverter for obtaining a signal waveform diagram, and then partitioning the signal waveform diagram into a plurality of phase voltage regions according to the zero voltage crossing points of the R-phase output voltage, the S-phase output voltage and the T-phase output voltage;
   (4) modulating a switching periodic signal waveform diagram of a R-phase switching member set, an S-phase switching member set, a T-phase switching member set, and a N-phase switching member set in the three-phase four-wire inverter through a Two Phase Modulation way, so as to make the switching periodic signal waveform diagram show centrally symmetrical;

(5) deriving a plurality of switching duty cycle matrix equations for each of the phase voltage regions through the first matrix equation, and then integrating all the switching duty cycle matrix equations to a second matrix equation;

(6) providing an equivalent RLC load for the at least one load, and then sampling a total current variation of the equivalent RLC load for three periods by using a controller;

(7) deriving a total current variation matrix equation according to the total current variation obtained by the step (6) and Kirchhoff's current law;

(8) using the total current variation matrix equation to estimate a specific resistance, a specific inductance and a specific capacitance for a parallel resistor, a parallel inductor and a parallel capacitor in the equivalent RLC load, respectively;

(9) substituting the specific resistance, the specific inductance and the specific capacitance into the second matrix equation, so as to obtain a next-period switching duty cycle for the R-phase switching member set, the S-phase switching member set, the T-phase switching member set, and the N-phase switching member set; and

(10) the R-phase switching member set, the S-phase switching member set, the T-phase switching member set, and the N-phase switching member set executing switching operations based on the next-period switching duty cycle, such that the three-phase four-wire inverter outputs an output voltage steadily.

2. The load impedance estimation and repetitive control method of claim 1, wherein the first equation is presented as follows:

$$\begin{bmatrix} u_{RN} \\ u_{SN} \\ u_{TN} \end{bmatrix} = \begin{bmatrix} L_R + L_N & L_N & L_N \\ L_N & L_S + L_N & L_N \\ L_N & L_N & L_T + L_N \end{bmatrix} \begin{bmatrix} \frac{di_R}{dt} \\ \frac{di_S}{dt} \\ \frac{di_T}{dt} \end{bmatrix} + \begin{bmatrix} v_{RN} \\ v_{SN} \\ v_{TN} \end{bmatrix}$$

wherein $u_{RN}$, $u_{SN}$ and $u_{TN}$ mean a R-phase switching voltage, a S-phase switching voltage and a T-phase switching voltage for the three-phase four-wire inverter, respectively; in addition, $L_R$, $L_S$, $L_T$, and $L_N$ respectively being the inductances of the R-phase output inductor, the S-phase output inductor, the T-phase output inductor, and the N-phase balance inductor; moreover, $i_R$, $i_S$, $i_T$ respectively being the inductor currents of the R-phase output inductor, the S-phase output inductor and the T-phase output inductor; furthermore, $V_{RN}$, $V_{SN}$ and $V_{TN}$ respectively being the voltage values of the R-phase output voltage, the S-phase output voltage and the T-phase output voltage.

3. The load impedance estimation and repetitive control method of claim 1, wherein the step (4) comprises a plurality of detailed steps of:

(41) analyzing a switching timing diagram of the R-phase switching member set, the S-phase switching member set, the T-phase switching member set, and the N-phase switching member set, and then partitioning the switching timing diagram to a plurality of switching timing intervals;

(42) setting the switching timing intervals to a plurality of excitation regions and a plurality of demagnetization regions;

(43) integrating the excitation regions, and then moving the excitation regions to the center of the switching timing diagram; and

(44) switching high-level signals in the demagnetization regions to low-level signals.

4. The load impedance estimation and repetitive control method of claim 1, wherein the total current variation matrix equation is presented as follows:

$$\begin{bmatrix} \Delta i_{V(\cdot)}(n-1) \\ \Delta i_{V(\cdot)}(n-2) \\ \Delta i_{V(\cdot)}(n-3) \end{bmatrix} = \begin{bmatrix} \Delta v_R(n-1) & \Delta v_C(n-1) & \Delta v_L(n-1) \\ \Delta v_R(n-2) & \Delta v_C(n-2) & \Delta v_L(n-2) \\ \Delta v_R(n-3) & \Delta v_C(n-3) & \Delta v_L(n-3) \end{bmatrix} \cdot \begin{bmatrix} k_{pR} \\ k_{pC} \\ k_{pL} \end{bmatrix}$$

wherein $\Delta i_{V(\cdot)}(n-1)$, $\Delta i_{V(\cdot)}(n-2)$ and $\Delta i_{V(\cdot)}(n-3)$ are respectively the total current variation of the equivalent RLC load in three periods;

wherein $\Delta v_R(n-1)$, $\Delta v_R(n-2)$ and $\Delta v_R(n-3)$ are respectively the voltage variations on the parallel resistor of the equivalent RLC load in three periods, and $k_{pR}$ being the reciprocal of the specific resistance of the parallel resistor;

wherein $\Delta v_C(n-1)$, $\Delta v_C(n-2)$ and $\Delta v_C(n-3)$ are respectively the voltage variations on the parallel capacitor of the equivalent RLC load in three periods, and $k_{pC}$ can be calculated by way of dividing the specific capacitance of the parallel capacitor by 2 T;

wherein $\Delta v_L(n-1)$, $\Delta v_L(n-2)$ and $\Delta v_L(n-3)$ are respectively the voltage variations on the parallel inductor of the equivalent RLC load in three periods, and $k_{pL}$ is equal to T/2 L; L being the specific inductance of the parallel inductor.

5. The load impedance estimation and repetitive control method of claim 2, wherein the switching duty cycle matrix equation is presented as follows:

$$\begin{bmatrix} D_{RH} \\ D_{TH} \\ D_{NH} \end{bmatrix} = \begin{bmatrix} \dfrac{L_R \Delta i_R - L_S \Delta i_S}{V_{DC}T} \\ \dfrac{-L_S \Delta i_S + L_T \Delta i_T}{V_{DC}T} \\ \dfrac{-L_N \Delta i_R - (L_S + L_N)\Delta i_S - L_N \Delta i_T}{V_{DC}T} \end{bmatrix} + \begin{bmatrix} \dfrac{V_{RS}}{V_{DC}} \\ \dfrac{-V_{ST}}{V_{DC}} \\ \dfrac{-V_{SN}}{V_{DC}} \end{bmatrix}$$

wherein $D_{RH}=(T_1+T_2+T_3)/T$, $D_{TH}=(T_2+T_3)/T$ and $D_{NH}=(T_3)/T$;

wherein T means the switching period of the R-phase switching member set, S-phase switching member set, T-phase switching member set, and N-phase switching member set;

wherein $\Delta i_R$, $\Delta i_S$ and $\Delta i_T$ are respectively the inductor current variation of the R-phase output inductor, S-phase output inductor and T-phase output inductor, and $V_{DC}$ being the DC input voltage of the three-phase four-wire inverter;

wherein $V_{RS}$ means a first voltage difference between the R-phase output voltage and S-phase output voltage, $V_{ST}$ meaning a second voltage difference between the S-phase output voltage and T-phase output voltage, and $V_{SN}$ meaning a third voltage difference between the S-phase output voltage and N-phase output voltage;

wherein $T_1$, $T_2$ and $T_3$ can be calculated by using following formula:

$$\begin{bmatrix} T_1 \\ T_2 \\ T_3 \end{bmatrix} = \begin{bmatrix} \frac{1}{V_{DC}} & 0 & -\frac{1}{V_{DC}} \\ 0 & 0 & \frac{1}{V_{DC}} \\ 0 & -\frac{1}{V_{DC}} & 0 \end{bmatrix} \begin{bmatrix} L_R + L_N & L_N & L_N \\ L_N & L_S + L_N & L_N \\ L_N & L_N & L_T + L_N \end{bmatrix}$$

$$\begin{bmatrix} \Delta i_R \\ \Delta i_S \\ \Delta i_T \end{bmatrix} + \begin{bmatrix} \frac{1}{V_{DC}} & 0 & -\frac{1}{V_{DC}} \\ 0 & 0 & \frac{1}{V_{DC}} \\ 0 & -\frac{1}{V_{DC}} & 0 \end{bmatrix} \begin{bmatrix} V_{RN} \\ V_{SN} \\ V_{TN} \end{bmatrix} T.$$

6. The load impedance estimation and repetitive control method of claim 5, wherein the second matrix equation is presented as follows:

$$\begin{bmatrix} D_A(n+1) \\ D_B(n+1) \\ D_N(n+1) \end{bmatrix} =$$

$$\frac{1}{V_{DC}T} \begin{bmatrix} L_A & -L_C & 0 \\ 0 & L_B & -L_C \\ -L_N & -L_N & -(L_N + L_C) \end{bmatrix} \begin{bmatrix} (-1)^{r-1}\Delta i_A(n+1) \\ (-1)^{r-1}\Delta i_B(n+1) \\ (-1)^{r-1}\Delta i_N(n+1) \end{bmatrix} + \begin{bmatrix} D_{AF}(n+1) \\ D_{BF}(n+1) \\ D_{NF}(n+1) \end{bmatrix}$$

wherein $D_A(n+1)$ and $D_B(n+1)$ means two next-period switching duty cycles for any two switching member sets in the R-phase switching member set, S-phase switching member set, and T-phase switching member set;

wherein $D_N(n+1)$ means the next-period switching duty cycle for the N-phase switching member set; moreover, r denoting to any one phase voltage region and being an integer ranged between 1-6;

wherein $\Delta i_A(n+1)$ and $\Delta i_B(n+1)$ are two next-period inductor current variations for any two output inductors in the R-phase output inductor, S-phase output inductor and T-phase output inductor; moreover, $\Delta i_N(n+1)$ is the next-period inductor current variation for the N-phase balance inductor;

wherein $D_{AF}(n+1)$ and $D_{BF}(n+1)$ are respectively two modulated duty cycles for ant two phases in the R-phase, the S-phase and the T-phase of the three-phase four-wire inverter; moreover, $D_{NF}(n+1)$ is the modulated duty cycle for the N-phase of the three-phase four-wire inverter.

7. The load impedance estimation and repetitive control method of claim 6 wherein the step (9) comprises a plurality of detailed steps of:

(91) calculating a resistor current variation of the parallel resistor, a inductor current variation of the parallel inductor, a capacitor current variation of the parallel capacitor according to the specific resistance, the specific inductance and the specific capacitance obtained by the step (8), respectively;

(92) substituting the resistor current variation, the inductor current variation and the capacitor current variation can be obtained by the step (91) into the second matrix equation, so as to calculate the next-period switching duty cycle for the R-phase switching member set, the S-phase switching member set, the T-phase switching member set, and the N-phase switching member set.

8. The load impedance estimation and repetitive control method of claim 7 wherein the step (91) is completed by using following current formulas (1), (2) and (3):

current formula (1):

$$\Delta i_{R(\bullet)}(n+1) = \frac{\Delta v_R(n+1)}{R} = \frac{v_{ref(\bullet)}(n+1) - v_{fb(\bullet)}(n)}{R}$$

current formula (2):

$$\Delta i_C(n+1) =$$
$$\frac{C}{2 \cdot T_s} \Delta v_c(n+1) = \frac{C}{2 \cdot T_s} \cdot [v_{ref}(n+2) - v_{ref}(n+1) - v_{fb}(n) + v_{fb}(n-1)]$$

current formula (3):

$$\Delta i_{L(\bullet)}(n+1) = \frac{\Delta v_L(n+1)}{2L} = \frac{v_{ref(\bullet)}(n+1) + v_{fb(\bullet)}(n)}{2L} \cdot T$$

wherein $V_{ref(\bullet)}$ and $V_{fb(\bullet)}$ mean a sinusoidal reference voltage and a feedback voltage, respectively.

* * * * *